US007409619B2

(12) United States Patent
El Far et al.

(10) Patent No.: US 7,409,619 B2
(45) Date of Patent: Aug. 5, 2008

(54) SYSTEM AND METHODS FOR AUTHORING DOMAIN SPECIFIC RULE-DRIVEN DATA GENERATORS

(75) Inventors: Ibrahim Khalil Ibrahim El Far, Bellevue, WA (US); Ivan Santa Maria Filho, Sammamish, WA (US)

(73) Assignee: Microsoft Corporation, Redmond, WA (US)

( * ) Notice: Subject to any disclaimer, the term of this patent is extended or adjusted under 35 U.S.C. 154(b) by 217 days.

(21) Appl. No.: 11/210,051

(22) Filed: Aug. 23, 2005

(65) Prior Publication Data
US 2007/0168813 A1 Jul. 19, 2007

(51) Int. Cl.
*G01R 31/28* (2006.01)
*G06F 11/00* (2006.01)
(52) U.S. Cl. ...................... 714/742; 714/724
(58) Field of Classification Search ................ 714/724, 714/742; 716/4; 717/124
See application file for complete search history.

(56) References Cited

U.S. PATENT DOCUMENTS

| 5,390,325 | A | * | 2/1995 | Miller | 714/38 |
| 5,490,249 | A | * | 2/1996 | Miller | 714/38 |
| 5,652,835 | A | * | 7/1997 | Miller | 714/38 |
| 5,757,820 | A | * | 5/1998 | Angelotti | 714/738 |
| 2006/0282723 | A1 | * | 12/2006 | Pleasant et al. | 714/724 |

OTHER PUBLICATIONS

"Designing an open test software architecture featuring Lockheed Martin LM-STAR/spl reg/ case study" by McDonell,et al. This paper appears in: AUTOTESTCON 2004. Proceedings Publication Date: Sep. 20-23, 2004 On pp. 202-208 ISSN: 1088-7725 ISBN: 0-7803-8449-0 INSPEC Accession No. 8520915.*
"Software testing with Kitss" by Nonnenmann et al. This paper appears in: IEEE Expert [see also IEEE Intelligent Systems and Their Applications] Publication Date: Aug. 1993 vol. 8, Issue: 4 On pp. 25-30 ISSN: 0885-9000 INSPEC Accession No. 4521564.*
"KITSS—a functional software testing system using a hybrid domain model" by Nonnenmann et al. This paper appears in: Artificial Intelligence for Applications, 1992., Proceedings of the Eighth Conference on Publication Date: Mar. 2-6, 1992 On pp. 136-142 ISBN: 0-8186-2690-9 INSPEC Accession No. 4286594.*

* cited by examiner

*Primary Examiner*—Cynthia Britt
(74) *Attorney, Agent, or Firm*—Amin, Turocy & Calvin, LLP

(57) ABSTRACT

An automated data generation system and methods are provided to facilitate generation of test data sets for computerized platforms while mitigating the need to store massive quantities of potentially invalid test data. In one aspect, a computerized test system is provided. A rules component is provided to specify one or more data domains for a test data set. A data generator employs the rules component to generate the test data set, where the test data set is then employed to test one or more computerized components.

18 Claims, 11 Drawing Sheets

SYSTEM AND METHODS FOR AUTHORING DOMAIN SPECIFIC RULE-DRIVEN DATA GENERATORS

BACKGROUND

Computer programs are based on algorithms and data structures. Data structures are used to hold and organize information that is manipulated by algorithms to accomplish a particular result. The nature of the data manipulated can in many ways change the behavior of algorithms that processes such data. Algorithms usually define or imply a set of valid data and often protect themselves from invalid data. Thus, it is possible to imply that each algorithm can work with a predefined data domain. For instance, algorithms that perform arithmetic calculations usually cannot manipulate strings of characters as the expected results are not defined for that data type. In some cases, the very nature of the data can cause a system malfunction as, for instance, when an algorithm tries to divide a number by zero. Such malfunctions can be as severe as causing a computer to restart or worse—causing data loss.

While testing software, it is generally not surprising that there is great interest in defining what meaningful data for a particular algorithm is. Not only valid data the algorithm expects and can be used to verify correctness, but also invalid data that may cause system malfunction—something programmers often struggle to detect and correct before customers are affected. Often the very nature of the data the algorithm expects defines which values are interesting and which are not. For example, computers are limited machines with finite storage capacity and data that borders the limit of what a computer can handle and thus, is of interest for testing. For instance, assume a computer can only handle integer numbers up to 10. If an algorithm tries to add 10+10 an error will occur, thus 10 is an interesting or relevant number for testing an algorithm that adds two numbers. Another example is that computers cannot represent floating point numbers such as 0.1 exactly—they represent approximations of such numbers. Therefore, making calculations with such numbers is interesting to find rounding errors in some example application such as payroll or tax calculation programs.

Each type of data a computer can manipulate along with processing capacity of the computer itself may imply both a valid data domain and an invalid data domain. Such domains may be continuous or discrete and not necessarily easy to define. Even seemingly innocuous data types such as strings of characters—used to store sentences—can cause system malfunction, data loss or even cause security and privacy risks. It takes time and dedication to understand and define a set of data values that correctly and thoroughly exercise a particular algorithm. One may store sample data acquired over years of testing and use the same data set for the same class of computer programs. Unfortunately storing, organizing and adapting such data to each program is hard and error-prone as the input each program expects vary and the data often requires manipulation before being reused. It is also hard to inventory and categorize such data so prospective testers can verify completeness of their data domain coverage.

SUMMARY

The following presents a simplified summary in order to provide a basic understanding of some aspects described herein. This summary is not an extensive overview nor is intended to identify key/critical elements or to delineate the scope of the various aspects described herein. Its sole purpose is to present some concepts in a simplified form as a prelude to the more detailed description that is presented later.

An automated data generation system is provided for generating test data sets that are employed to test the limits of various software components and algorithms. Instead of maintaining a massive data store of potential test data subsets for algorithm testing, another manner in which to store the data is not to store the data itself, but to store rules and specifications on how to generate equivalent data and supply methods to generate the data from such specifications. Such storage is potentially more concise than storing the data itself and when properly annotated is easier to inventory and probe for completeness. Since the test data is generated from its specification, it can be easily adapted to exercise new applications by replacing or modifying the output of the data generation mechanism or component.

Various aspects for such data generation system include the ability to represent and posteriorly generate data for arbitrary data types such as primitive scalar types handled by computers such as integer, character and floating point data. Other types may include simple or value scalar types created from the composition of scalar types such as string of characters or simple record of data, whereas still other types include complex structures such as classes or structures. To generate relevant data testing sets, a language definition is provided to express domains of data—which can include an extended form of BNF, for example, that can also express attributed managed classes or structures. A generic data generator is provided that manipulates a data domain definition to produce generic representations of instances of that domain, where a contract, or interface, is established for converting this generic representation to an instance of the desired data type.

To the accomplishment of the foregoing and related ends, certain illustrative aspects are described herein in connection with the following description and the annexed drawings. These aspects are indicative of various ways which can be practiced, all of which are intended to be covered herein. Other advantages and novel features may become apparent from the following detailed description when considered in conjunction with the drawings.

DETAILED DESCRIPTION

An automated data generation system and methods are provided to facilitate generation of test data sets for computerized platforms while mitigating the need to store massive quantities of potentially invalid test data. In one aspect, a computerized test system is provided. A rules component is provided to specify one or more data domains for a test data set. A data generator employs the rules component to generate the test data set, where the test data set is then employed to test one or more computerized components. Such components can include algorithms or applications that have differing test data limits and data type requirements that can be automatically exercised and tested according to the generated test data set.

As used in this application, the terms "component," "object," "interface," and the like are intended to refer to a computer-related entity, either hardware, a combination of hardware and software, software, or software in execution. For example, a component may be, but is not limited to being, a process running on a processor, a processor, an object, an executable, a thread of execution, a program, and/or a computer. By way of illustration, both an application running on a server and the server can be a component. One or more components may reside within a process and/or thread of execution and a component may be localized on one computer and/or distributed between two or more computers. Also, these components can execute from various computer readable media having various data structures stored thereon. The components may communicate via local and/or remote processes such as in accordance with a signal having one or more data packets (e.g., data from one component interacting with another component in a local system, distributed system, and/or across a network such as the Internet with other systems via the signal).

Figure 1:
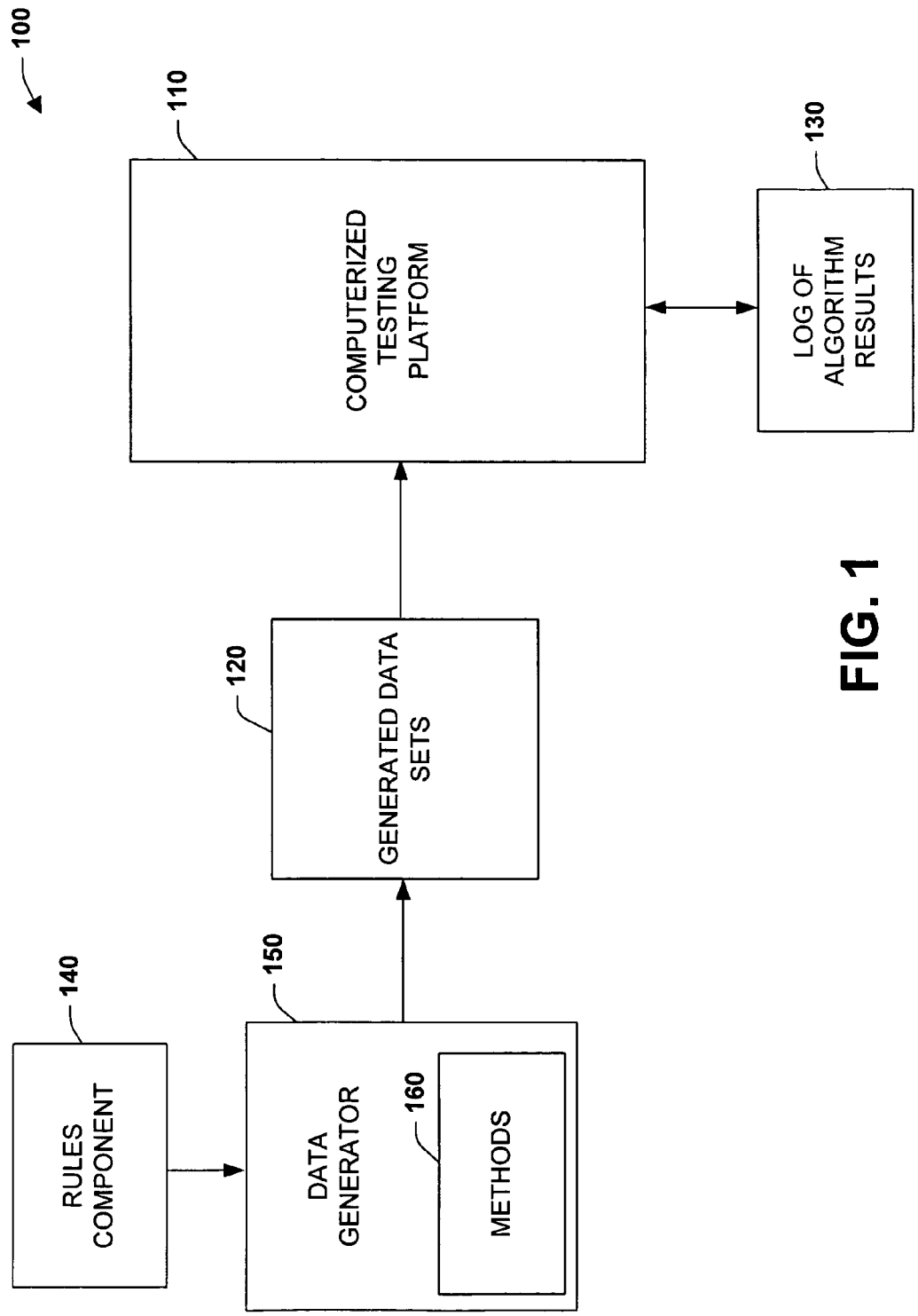
FIG. 1 is a schematic block diagram illustrating an automated testing and data generation system.

Referring initially to FIG. 1, an automated component testing system 100 is illustrated. The system 100 includes a computerized testing platform 110 that is can run various types of algorithms, applications, or components. For instance, the platform 110 could be an operating system or other large component where the components under test can include substantially any type of computer component such as drivers, software, network components, input/output (I/O) components, buses or controllers, memory components, processor components, databases, peripheral components, and so forth. In order to test various components, the computerized platform 110 processes one or more automatically generated data sets 120. After processing such data and/or executing tests in accordance with the data sets 120, a log 130 can capture results of the tests such as reporting how a particular test reacted to a given data set 120.

A rules component 140 is provided that includes rules and/or specifications relating to what type of data should be generated for the data sets 120. A data generator 150 having one or more automated methods 160 processes the rules and specifications from the rules component 140 in order to generate the data sets 120. In this manner, rather than storing actual test data, data specifications for data is stored in the rules component 140 which then facilitates accurate and flexible testing in the platform 110 along with promoting adaptability to new algorithms which may be subsequently tested therein.

Various aspects for data generation in the system 100 include the ability to represent and generate data for arbitrary data types such as primitive scalar types handled by the platform 110 such as integer, character and floating point data. Other types may include simple or value scalar types created from the composition of scalar types such as string of characters or simple record of data, whereas still other types can include complex structures such as classes or structures. To generate relevant data testing sets, a language definition is provided to express domains of data—which can include an extended form of BNF, for example, that can also express attributed managed or unmanaged classes or structures. It is noted that managed classes are generally classes that are associated with managed objects and memories where respective object lifetimes are managed from components such as garbage collectors. Unmanaged classes and objects have object lifetimes managed by the classes themselves through such mechanisms as reference counting for example.

The data generator 150 manipulates the data domain definition to produce generic representations of instances of that domain, where a contract, or interface, is established for converting this generic representation to an instance of the desired data type in the generated data set 120. The data generator 150 can be employed to populate and facilitate the design of data type-agnostic and computer program-agnostic tests at the platform 110. Interfaces are provided to convert well known representations of generic data into arbitrary data of the types needed for testing a given algorithm or application. This can include the dual use of either C#-or enhanced BNF grammar rules or attributed managed runtime classes, for example, to express domains of data via the rules component 140. Such data domains can be designed to provide "interesting" values of specific data types, where interesting refers to data values that are likely to stress or exercise an algorithm or component in a desired manner and confidence.

Before proceeding, it is noted that various roles can be established for different entities within the system 100. One role is established by a user who specifies the rules for data generation. This can include defining data types to be used, defining the domain of data, defining the criteria for test generation, and selecting how to convert data into representations of a desired type. Another role in the system 100 includes an automated reader (not shown) that generally interprets the domain of data creates a general purpose representation of that domain. Another type role includes a derivation space explorer (not shown) that explores the data domain to produce data representations of data instances. The data generator 150 has a role then in facilitating that a generic generation of data is successful and converting generic data into the data sets that are interesting or suitable for algorithm testing on the platform 110.

Figure 2:
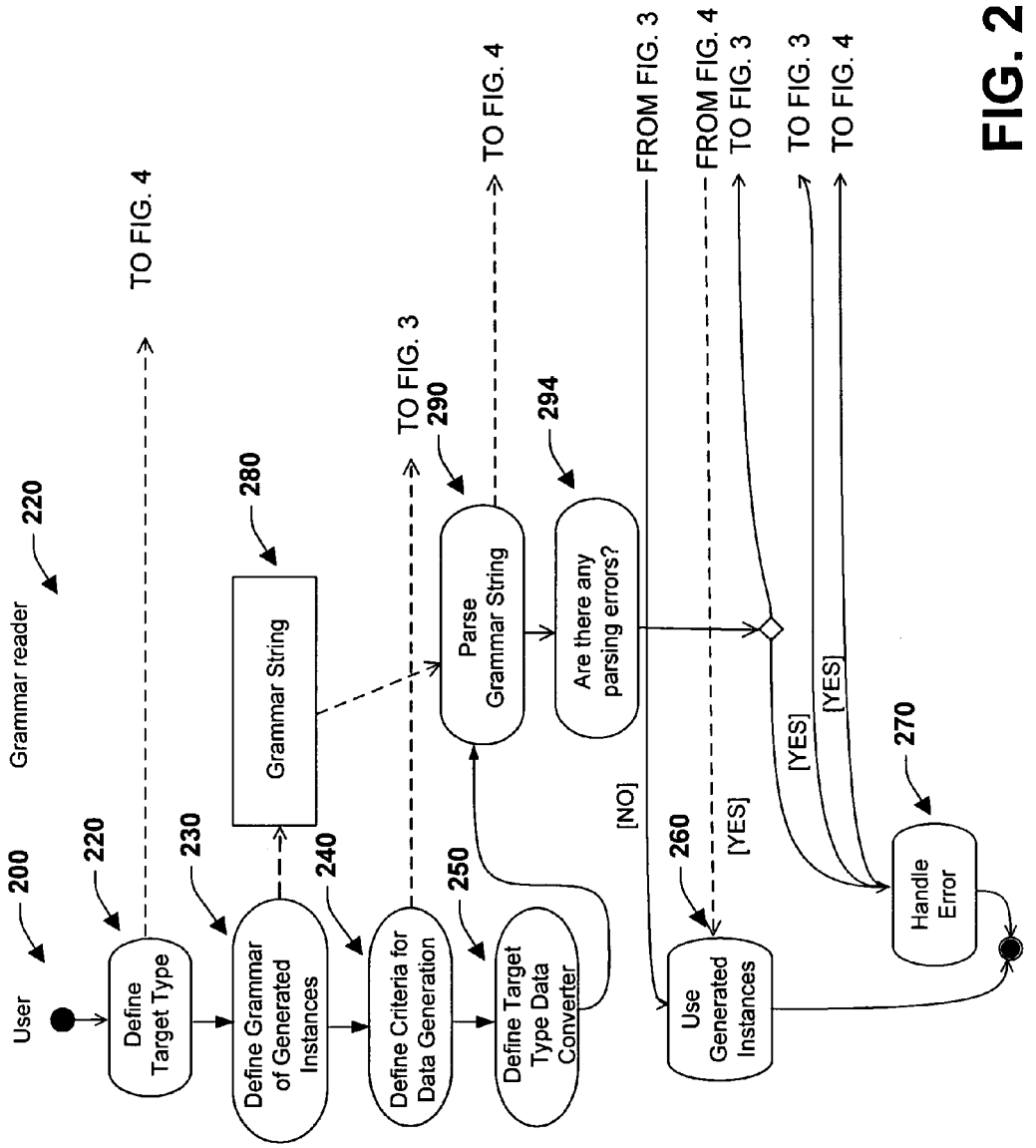
FIGS. 2-4 illustrate an automated data generation process.
Figure 3:
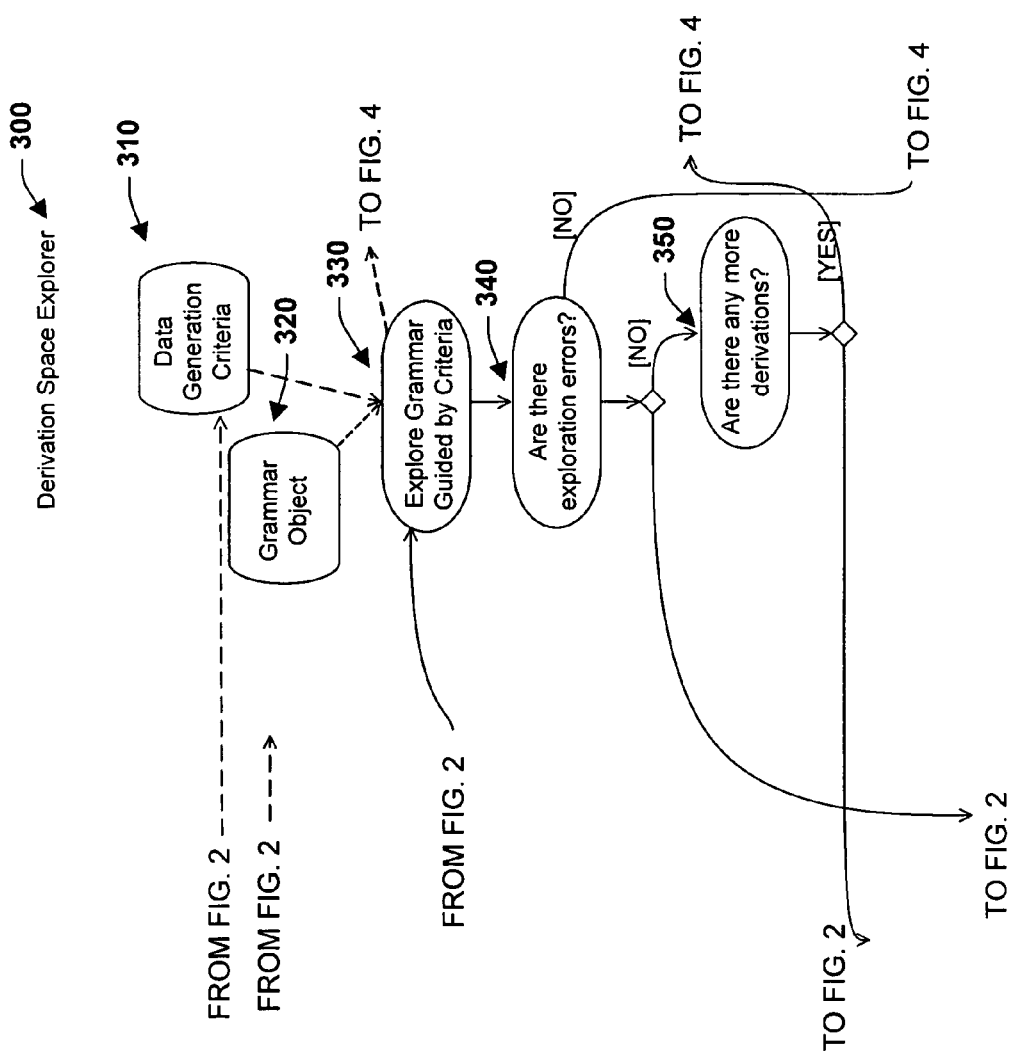
Figure 4:
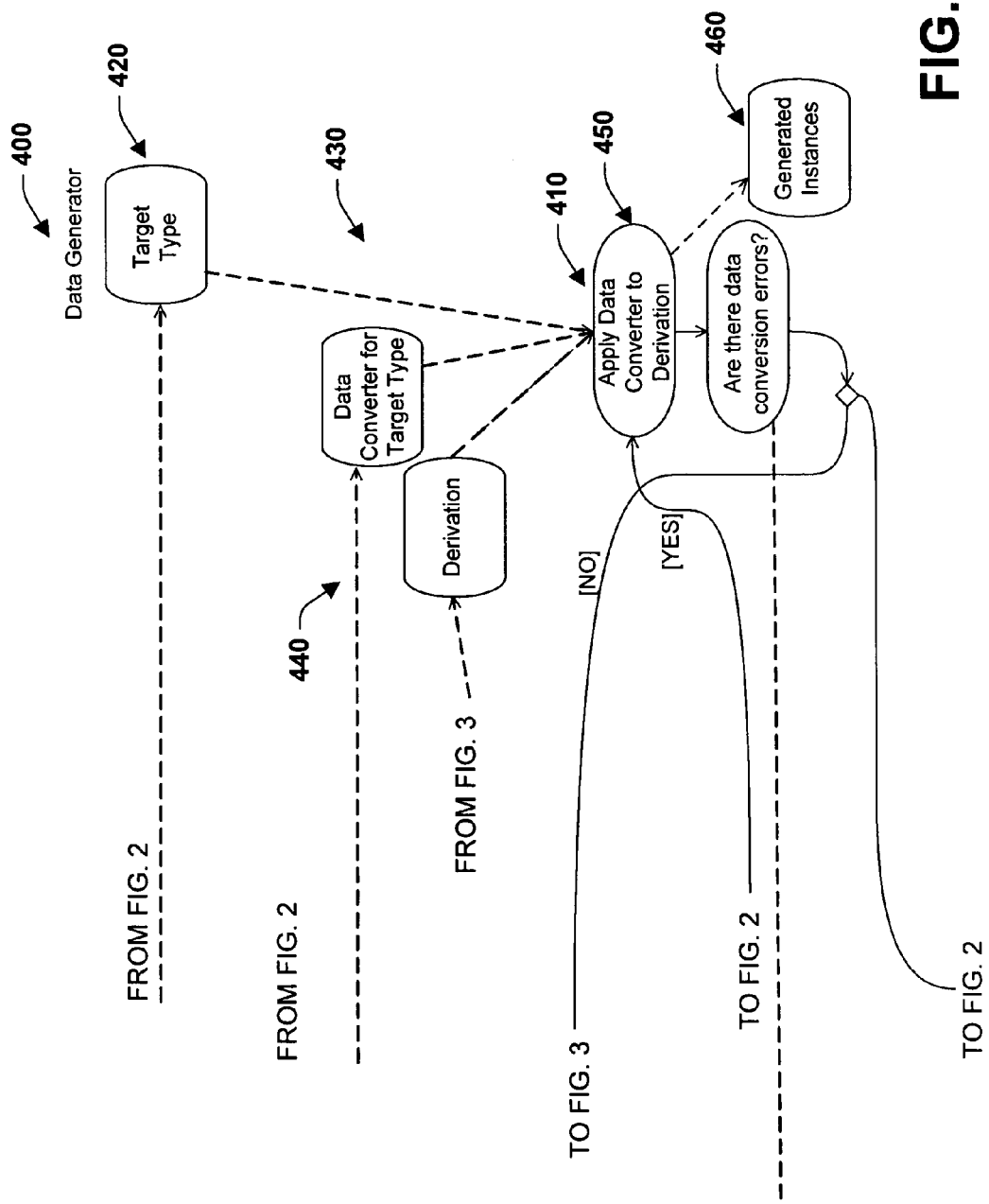

Referring now to FIGS. 2-4, an automated data generation process is illustrated. While, for purposes of simplicity of explanation, the process is shown and described as a series or number of acts, it is to be understood and appreciated that the subject process is not limited by the order of acts, as some acts may, in accordance with the subject process, occur in different orders and/or concurrently with other acts from that shown and described herein. For example, those skilled in the art will understand and appreciate that a methodology could alternatively be represented as a series of interrelated states or events, such as in a state diagram. Moreover, not all illustrated acts may be required to implement a methodology in accordance with the subject process.

FIGS. 2-4 illustrate a process for various roles that can be provided to generate testing data sets. FIG. 2 illustrates a user role process 200 and a grammar reader process 210 which operate collectively with the processes outlined in FIGS. 3 and 4 in a test data generation process. As noted above, the user role at 200 can include various aspects such defining the managed runtime type of data to be used. For example: data representing the "Author" of a type "Document" is of type "System.String". Another user role 200 defines the domain of data. For example: data representing the "Author" should only be a delimited list of strings of characters with a semicolon or comma as delimiters. Yet another role 200 include defining the criteria for test generation which can include the method for generation (e.g., random, systematic) and/or the limits on generation (e.g., the number of instances). Another role 200 includes determining how to convert data in a well-known representation to a desired type. For example: when the generator produces a structure that contains a generated "Author" value, how does this convert to a "System.String"? As can be appreciated, a plurality or varying conversions can be provided.

Proceeding to 220 of FIG. 2, the user defines one or more target types which are also employed in a data generator process described in FIG. 4. At 230, respective grammar of generated instances is defined. At 240 various criteria for data instances are defined. At 250, one or more target types are defined for a data converter. These definitions are the employed by the grammar reader 210. Other process aspects of the user role 200 include producing any user generated data set instances at 260 in accordance with any generated instances from a data generator process described in more detail with respect to FIG. 4. This can include processing errors from various data generation components at 270.

The grammar reader at 210 processes one or more grammar strings at 280. Such reader 210 can be considered a parser or parsing function for processing the strings. The Grammar Reader 210 is part of the data generation system described above and interprets the domain of the data. This process 210 also creates a general purpose representation of that domain that can be used by the generator. At 290, strings read at 280 are parsed by the reader 210. Output from the parser is passed to a space explorer described in FIG. 3. At 294, a determination is made as to whether any parsing errors have been encountered. If so, the process proceeds to 270 for further error handling and processing. If not, the grammar reader process 210 proceeds to FIG. 3.

Proceeding to FIG. 3, a derivation space explorer process 300 is illustrated. As noted above, the derivation space explorer is a generic generator that is part of the data generation system. This process explores the data domain to produce well known representations of data instances and continues iterating until the data generation criteria are met. Proceeding 310 and 320 respectively, data generation criteria grammar objects are received from the process 200. At 330, encountered grammar objects 320 are compared against data generation criteria 310 to determine if any errors exist. If no errors are encountered 340, the process proceeds to the data generator process depicted in FIG. 4. If errors are encountered at 340, the process proceeds to 270 of FIG. 2 for further error handling. At 350, a determination is made as to whether or not any more data derivations are encountered. If not, the process proceeds to 260 of FIG. 2. If yes, the process proceeds to the data generator of FIG. 4.

Proceeding to 400 of FIG. 4, a data generator process is provided. As noted above, the data generator facilitates that the generic generation of data is successful and converts the generic data into data interesting to the user such as is suitable to test an algorithm in a desired manner. At 410, target types 420, received from 220 of FIG. 2, data converters for target types received from 250 of FIG. 2, and data derivations 440 received from 330 of FIG. 3, are processed to apply a respective data converter to an associated derivation. At 450, if any errors are determined, the process 400 proceeds to 270 of FIG. 2 for further error handling or processing. If no errors are encountered, the process generates one or more data test instances at 460 which can then be employed on a computerized testing platform to validate various components or algorithms.

Figure 5:
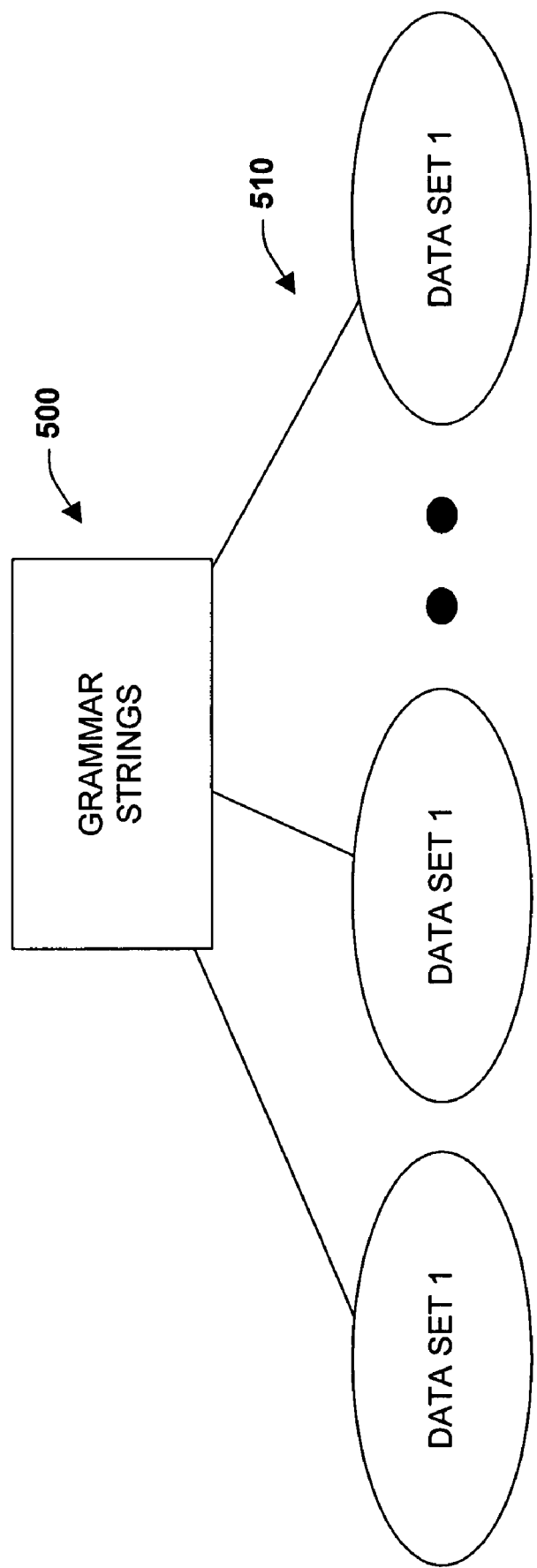
FIG. 5 illustrates example data generation from grammar strings.

Referring to FIG. 5, grammar strings 500 are illustrated that can be utilized to specify one or more testing data sets 510. As can be appreciated, other language constructs than strings can be employed to specify data sets 510. In one example, expressions can be of the form—A|B|C and so forth where the grammatical expression that implies: run this test with A, then run this test with B, then run this test with C and so forth. Grammars express the domain of data to be generated by the generic data generators described above. The following provide some example coding samples to illustrate possible grammar strings 500.

Sample 1:

```
%% This sample demonstrates built in types.
"Bit:",              BIT,             "\r\n",
"Bool:",             BOOL,            "\r\n",
"SByte:",            SBYTE,           "\r\n",
"Byte:",             BYTE,            "\r\n",
"Char:",             CHAR,            "\r\n",
"Short:",            SHORT,           "\r\n",
"Ushort:",           USHORT,          "\r\n",
"Int:",              INT,             "\r\n",
"Uint:",             UINT,            "\r\n",
"Long:",             LONG,            "\r\n",
"Ulong:",            ULONG,           "\r\n",
"Float:",            FLOAT,           "\r\n",
"Double:",           DOUBLE,          "\r\n",
"Decimal:",          DECIMAL,         "\r\n",
"PositiveSbyte:",    PositiveSbyte,   "\r\n",
"NegativeSbyte:",    NegativeSbyte,   "\r\n",
"PositiveShort:",    PositiveShort,   "\r\n",
"NegativeShort:",    NegativeShort,   "\r\n",
"PositiveInt:",      PositiveInt,     "\r\n",
"NegativeInt:",      NegativeInt,     "\r\n",
"PositiveLong:",     PositiveLong,    "\r\n",
"NegativeLong:",     NegativeLong,    "\r\n",
"PositiveFloat:",    PositiveFloat,   "\r\n",
"NegativeFloat:",    NegativeFloat,   "\r\n",
"PositiveDouble:",   PositiveDouble,  "\r\n",
"NegativeDouble:",   NegativeDouble,  "\r\n",
"PositiveDecimal:",  PositiveDecimal, "\r\n",
"NegativeDecimal:",  NegativeDecimal, "\r\n",
"Probability:",      Probability,     "\r\n",
"Digit:",            Digit,           "\r\n",
;
```

Sample 2:
%% This demonstrates how to express choices
%% This rule produces a choice followed by a new line.
Root=Choice, " ", WeightedChoice, "\r\n";
%% This rule produces one of the listed four choices.
Choice="Choice1"|"Choice2"|"Choice3"|"Choice4";
%% This rule produces one of the listed weighted four choices.
WeightedChoice="Weighted1"~1 |"Weighted2"~5 |"Weighted3"~7 |"Weighted4"
$start Root;
Sample 3:
%% This sample demonstrates different grammar term sequences.
%% This rule specifies a test to be the sequences following by newline
Test=Sequence, '\r\n';
%% This rule produces a sequence of three terms:
Sequence=
 [Optional], %% This term is optional, delimited by [ ]
 {Repeated}, %% This term is repeated, delimited by { }
 (Grouped) %% This term is just grouped, delimited by ( )
%% The following rules define each of the terms.
Optional="This text is optional: it may or may not appear.\r\n";
Repeated="This text will probably repeat.\r\n";
Grouped="This text will always appear.\r\n";
$start Test;

Sample 4:

```
%% This sample shows different ways of repeating terms.
Repeated =
    {NTimes},          %% Repeated n to m times where n,m are
                       %% specified in the configuration
    5*FiveTimes,       %% Repeated exactly 5 times
    3:7*ThreeSeven,    %% Repeated 3 to 7 times
    {[ZeroOrMore]},    %% Repeated 0 to m times where n,m are
                       %% specified in the configuration
    4*[UpToFour],      %% Repeated 0 to 4 times
    0:4*UpToFour2,     %% Also, repeated 0 to 4 times
    5*{FiveRange}      %% Repeated somewhere between 5*n and
                       5*m
                       %% where n,m are specified in the
                       configuration;
%% Note that n is the entity referred to as number of repeitions in the
configuration
%% The following rules define each of the terms shown above.
NTimes = "N to M times.\r\n";
FiveTimes = "5 times.\r\n";
ThreeSeven = "3 to 7 times.\r\n";
ZeroOrMore = "0 to M times.\r\n";
UpToFour = "0 to 4 times.\r\n";
UpToFour2 = "another 0 to 4 times.\r\n";
FiveRange = "5xn to 5xm times.\r\n";
$start Repeated;
```

Sample 5:
%% This sample demonstrates parameters, and parameter passing
%% This test first generates a string that involves producing
%% a string value called produce, that is then used by
%% the nonterminal Consumer. A newline ends the test.
Test=
    Producer<^product>,
    Consumer<product>,
    "\r\n"
%% ?^O? assigns the string value of the preceding expression,
%% in this case ProductName, to output parameter with index 0,
%% in this case product.
%% ^denotes an output parameter
%% all parameters are of type string
Producer
    <^product>
=
    "Produce", ProductName, ^0, ".\r\n"
%% ?#product? is replaced by the value of parameter product.
Consumer
    <product>
=
    "Consume", #product, ".\r\n"
ProductName
=
    "A"|"B"|"C"|"D"|"E"
%% The start symbol cannot have parameters.
$start Test;
  Sample 6:
Test =
    DevelopProduct<^productName, ^productVersion>,
    UseProduct<productName>, "\r\n"
%%?succ<productName>, 1? produces the successor of a variable
%% initialized to 1 and named using the value of product-Name
%% ?+Versions<productName>? adds the previous expression, in this case
%% the result of ?succ<productName>, 1?, to the rule corresponding to
%% Version<productName> with that specific value of productName
DevelopProduct
    <^productName, ^productversion>
=
    "Develop", ProductName, ^0,
    "version", ?succ<productName>, 1?, ^1,
    +Version<productName>,
!CurrentVersion<productName>,
"\r\n"
ProductName="A"|"B"|"C"|"D";
UseProduct
    <productName>
=
    "Useproduct", #productName,
    "version", Version<productName>,
    ", noting that current version is ",
    CurrentVersion<productName>, "\r\n"
$start Test;
  Sample 7:
%% This sample demonstrates flush action and exceptions
Test=
    "A statement will follow if a unique identifier is chosen. Otherwise only an empty line will follow.\r\n",
Statement, "\r\n"
Statement=
    "This is a unique identifier:", UniqueIdentifier, ".\r\n"
%% Identifier—ExistingIdentifier rewrite Identifier and then
%% checks to make sure it is not in ExistingIdentifier. If it is
%% not there, then it is "unique" and the identifier is returned,
%% but if it is, an empty string is returned instead.
%% ?@Statement? flushes all the string generated by the Statement
%% nonterminal if the previous expression is an empty string.
UniqueIdentifier=
    Identifier—ExistingIdentifier, @Statement, +ExistingIdentifier
%% An identifier is defined in restricted manner on purpose,
%% so an exception may occur in a reasonable amount of time.
Identifier=1:3*("A"|"B"|"C");
$start Test;
  Sample 8:
%% This sample demonstrates invisible nonterminal references
Test=%VariableName<^name>, UseVariableName<name>, "\r\n"
VariableName
    <^name>
=
    ("A"|"B"|"C"),
UseVariableName
    <name>
=
    "return f(", #name,");"
$start Test;
  Sample 9:
%% This sample illustrates how to compute all combinations
%% given a number of choices
Combination=
    "f(", foreach(A),");\r\n"
A="value1"|"value2"|"value3"|"value4"
$start Combination;
  Sample 10:
%% This sample produces simple classes.

Figure 6:
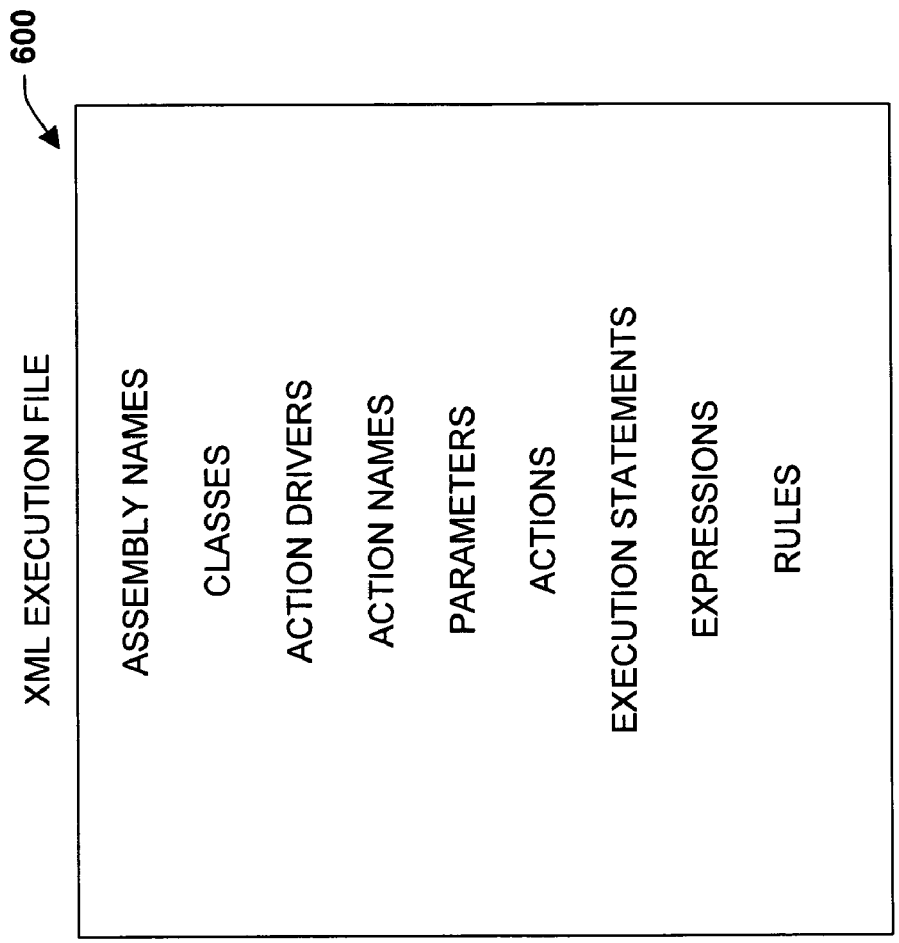
FIG. 6 illustrates an example XML execution file for grammar strings.

Producer="namespace Test {\r\n",
  DeclareClasses,
  "}\r\n";
DeclareClasses=
  {DeclareClass}
DeclareClass=
  ClassHeader<ˆclassName>,
  "{\r\n",
  ClassBody<className>,
  "}\r\n"
ClassHeader
  <ˆclassName>
=
  "publicclass", ClassName<ˆclassName>, "\r\n"
ClassName
  <ˆclassName>
=Identifier—UsedClassName,
  @DeclareClass, +UsedClassName,ˆ0
ClassBody
  <className>
=DeclareFields<className>
DeclareFields
  <className>
={DeclareField<className>}
DeclareField
  <className>
="int", FieldName<className>, ";\r\n"
FieldName
  <className>
=Identifier-UsedFieldName,
  @DeclareField, +UsedFieldName<className>
Identifier=5:8*(SmallLetter|CapitalLetter)
$startProducer;
  Sample 11:
%%This sample uses the results produced by sample 10.
%%
!include"Sample10.gr"
Consumer=
  "namespace Test {\r\n",
  "public cls Testclass {\r\n",
  "public static void Main(string[ ]args) {\r\n",
  Use,
  "}\r\n",
  "}\r\n",
  "}\r\n"
Use=
  {DeclareAVariable<ˆvar, ˆcls>,
  AssignFields<var, cls>}
DeclareAVariable
  <ˆvar,ˆcls>
=
  UsedClassName,ˆ1, "", VariableName<ˆvar>, Endstatement
VariableName
  <ˆcls>
=
  Identifier—UsedVariableName,
  @Use, +UsedVariableName, ˆ0
AssignFields
  <var, cls>
=
  #var, New, #cls, NoParam, EndStatement,
  {#var, Period, UsedFieldName<cls>, Assign, INT, EndStatement}
Identifier=1:8*(SmallLetter|CapitalLetter);
EndStatement=";\r\n";
NoParam="( )";
New="=new";
Period=".";
Assign="=";
$startConsumer;

FIG. 6 illustrates an example XML file 600 that employs grammatical strings to iterate over various instances. As illustrated, the file 600 can include several elements including assembly names, classes, action drivers, action names, parameters, actions, execution statements, expressions such as the grammatical strings described above, and one or more rules. The following XML fragment illustrates a string execution example.

<FMHCaseArea="\Storage\Project\FileSystemProperty Promotion\OleDoc"Author="ibrahime"Category= "Functional"
Name="DemoteDelimitedListChange"Priority="P1">
<FileMetadataHelper
Assembly="Company.ProjectTest.FileMetadataHandling. DocHandler.dll"
Class="Company.ProjectTest.FileMetadataHandling.Doc Handler.DocFileMetadataDr iver"/>
<TestDriverAssembly="Company.ProjectTest.Frameworks. dll"
Class="Company.ProjectTest.Frameworks.TestDrivers. ActionTestDriver"/>
<ActionDriverName="CreateFile"
Assembly="Company.ProjectTest.FileMetadataHandling. dll"
Class="Company.ProjectTest.FileMetadataHandling. CreateFileActionDriver"/>
<ActionDriverName="WriteFileMetadata"
Assembly="Company.ProjectTest.FileMetadataHandling. dll"
Class="Company.ProjectTest.FileMetadataHandling. WriteFileMetadataActionDriver "/>
<ActionDriverName="WriteItemMetadata"
Assembly="Company.ProjectTest.FileMetadataHandling. dll"
Class="Company.ProjectTest.FiIeMetadataHandling. WriteItemMetadataActionDriver "/>
<ActionDriverName="MoveFile"
Assembly="Company.ProjectTest.FileMetadataHandling. dll"
Class="Company.ProjectTest.FileMetadataHandling.Move FileActionDriver"/>
<ActionDriverName="WaitForPromotion"
Assembly="Company.ProjectTest.FileMetadataHandling. dll"
Class="Company.ProjectTest.FileMetadataHandling. WaitForPromotionActionDriver "/>
<ActionDriverName="ValidateItemAgainstFileMetadata"
Assembly="Company.ProjectTest.FileMetadataHandling. dll"
Class="Company.ProjectTest.FileMetadataHandling. ValidateItemAgainstFileMetadat aActionDriver"/>
<ActionDriverName="DeleteFile"
Assembly="Company.ProjectTest.FileMetadataHandling. dll"
Class="Company.ProjectTest.FileMetadataHandling. DeleteFileActionDriver"/>
<ActionDriverName="RetrieveFileBackedItem"
Assembly="Company.ProjectTest.FileMetadataHandling. dll"
Class="Company.ProjectTest.FileMetadataHandling. RetrieveFileBackedItemActionD river"/>

```
<ActionDriverName="SaveItemChanges"
Assembly="Company.ProjectTest.FileMetadataHandling.
    dll"
Class="Company.ProjectTest.FileMetadataHandling.Save
    ItemChangesActionDriver"/>
=<setup>
=<ActionName="CreateFile">
<ParameterName="StoreName"Value="NTFS"/>
<ParameterName="FileExtension"
Expression="'doc'|'dot'|'mpp'|'ppt'|'vsd'|'vss'|'vst'|
    'wiz'|'xla'|'xls'"</Action>
<ActionName="MoveFile"/>
=<Action Name="WaitForPromotion">
<Parameter Name="Timeout" Value="60000"/>
</Action>
=<Action Name="ValidateItemAgainstFileMetadata">
<Parameter Name="ValidationIsStrong" Value="false"/>
</Action>
</Setup>
=<Execution>
<Action Name="RetrieveFileBackedItem"/>
=<Action Name="WriteItemMetadata">
<Parameter          Name="MetadataKey"
    Expression="'Author'|'Keywords'|'Company'"/>
=<Parameter Name="Metadata">
<Rules>List="Entity1"|"Entity1;Entity2"|"Entity1;Entity2;
    Entity3"|
"Entity2;Entity1"|"Entity1;Entity3;Entity2"||";"|";;"|"En-
    tity1;"|";Entity1"|
";Entity1;"|"Entity1;;Entity2"|"Entity1;Entity2;"|";Entity1;
    Entity2"|
";Entity1;Entity2;"|""|";"|";"|";"|";"|;;"|";"|";;"|";;
    "|"Entity1"|"Entity1 "|"Entity1"; $startList;</Rules>
</Parameter>
</Action>
<ActionName="SaveItemChanges"/>
</Execution>
=<Validation>
=<ActionName="ValidateItemAgainstFileMetadata">
<ParameterName="ValidationIsStrong"Value="true"/>
</Action>
</Validation>
<Publication/>
=<Cleanup>
<ActionName="DeleteFile"/>
</Cleanup>
</FMHCase>
```

Figure 7:
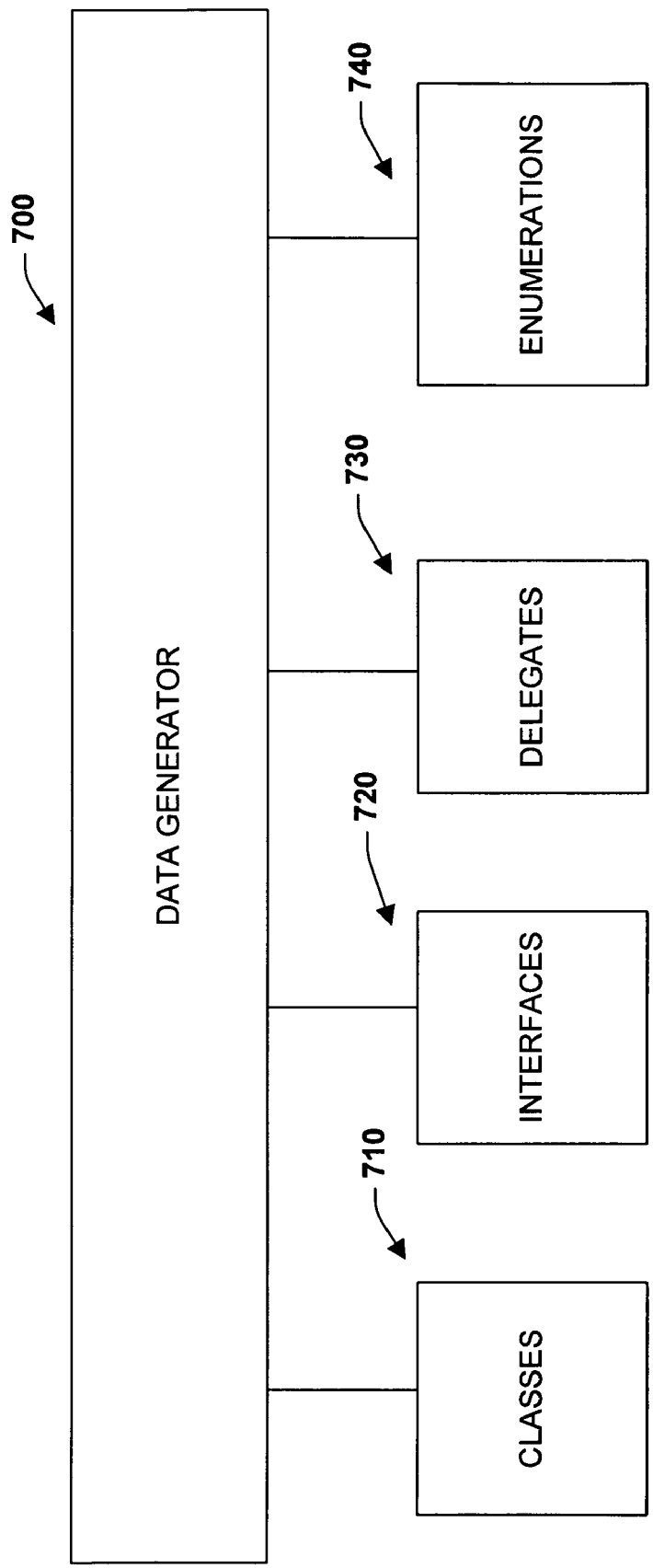
FIG. 7 illustrates example data generator components.

Referring to FIG. 7, a data generator 700 and associated components are illustrated. The data generator 700 can include one or more classes 710, interfaces 720, delegates 730, and enumerations 740. The classes can include converters, data generators, and generated data classes. Converter classes provide a set of convenience functions that convert raw data into rich, validated data of the appropriate type. Raw data is in the form that is produced by the corresponding generic data generator: the user does not need to know what the generator is in order to perform the conversion. Conversion is made to an appropriate data type, usually indicated by the name of the conversion function. Each function generally returns a rich structure that provides the data in a consumer ready form as well as other information such as a descriptor of the data's validity.

Interfaces 720 can include IDataGenerator or IGeneratedData, for example. Any generic data generators supported should implement this interface. This interface makes a few assumptions about data generation. 1) The rules of generation can be specified in grammar that can be stored as text or in a string. 2) Concepts like capacity and depth can be interpreted by the generator that implements this interface. Capacity usually refers to an upper limit on the number of test cases generated, and depth usually refers to an upper limit on the depth of traversal and or derivation involved in the generation process (usually used to recursion and such.) For IGeneratedData interfaces 720, raw data that is generated by some generic data generator is converted to the desired type, validated, and encapsulated in a structure that implements this interface, along with other useful information about the data and its generation. A delegate 730 includes a Data Validating Function which is a delegate for validating generated data before it is consumed by an application. A DataValidity enumeration 740 is an enumeration of data validity descriptors. It is used to determine whether it is appropriate to consume generated data.

Figure 8:
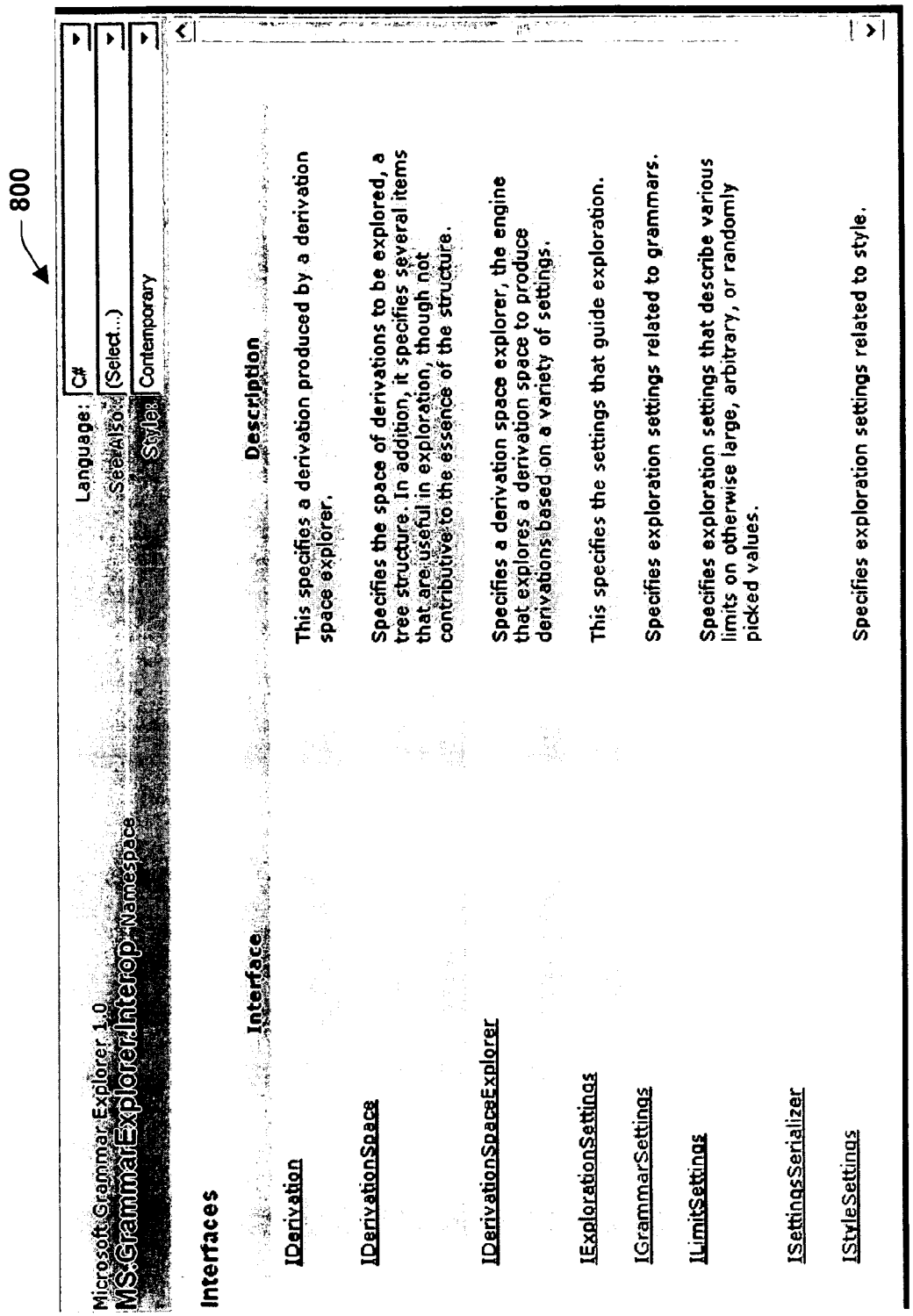
FIG. 8 illustrates example explorer interface components.

FIG. 8 illustrates possible example derivation explorer interfaces 800. These interfaces include: an IDerivation interface this specifies a derivation produced by a derivation space explorer; an IDerivationSpace interface specifies the space of derivations to be explored, a tree structure. In addition, it specifies several items that are useful in exploration, though not contributive to the essence of the structure. An IDerivationSpaceExplorer interface specifies a derivation space explorer, the engine that explores a derivation space to produce derivations based on a variety of settings; an IExplorationSettings interface specifies the settings that guide exploration; an IGrammarSettings specifies exploration settings related to grammars; an ILimitSettings specifies exploration settings that describe various limits on otherwise large, arbitrary, or randomly picked values; an ISettingsSerializer to serialize settings of exploration or de-serialize the settings to/from a stream (e.g., file); and an IStyleSettings specifies exploration settings related to style. As can be appreciated, other interfaces and functionality could also be provided.

Figure 9:
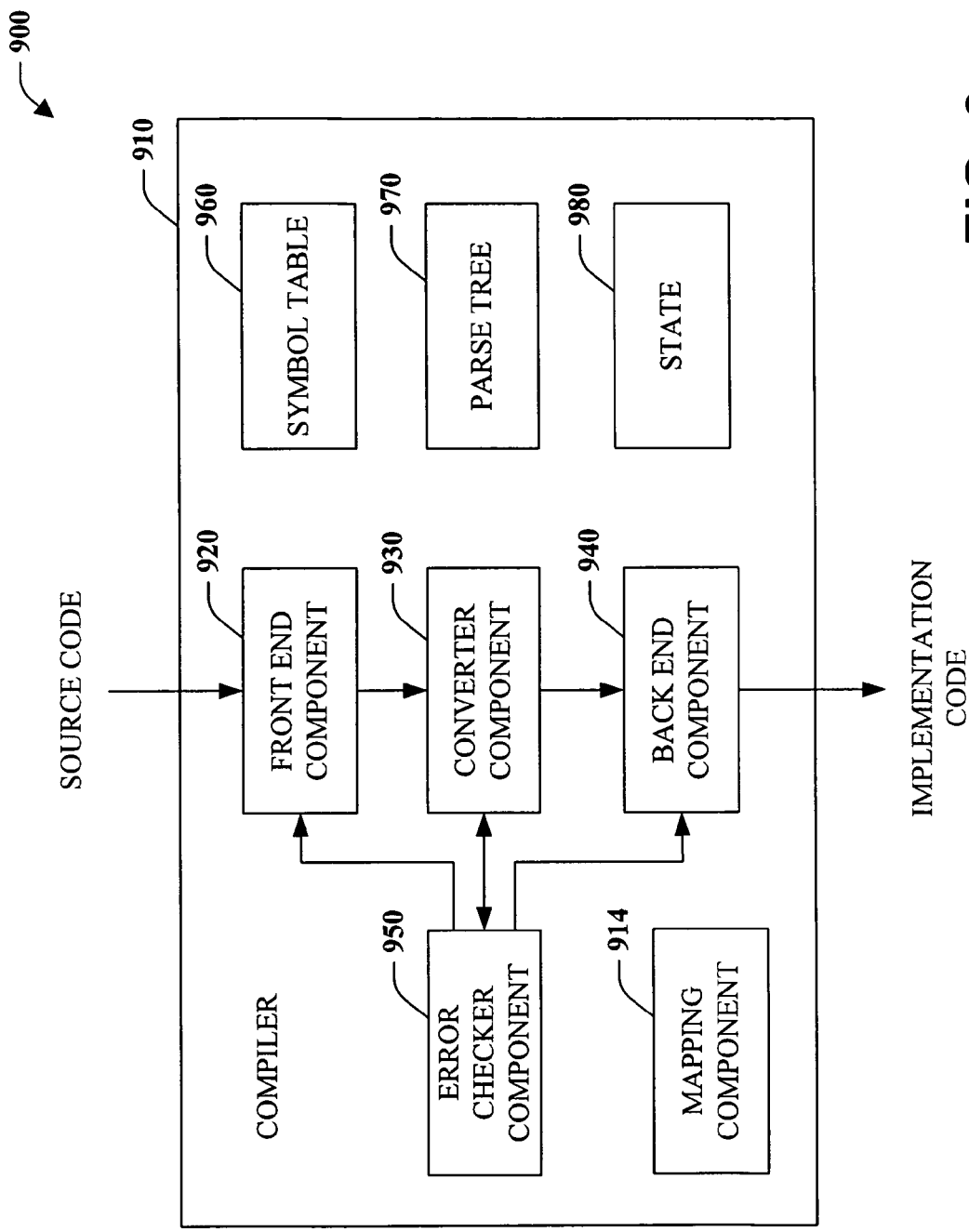
FIG. 9 illustrates an example compiler system.

FIG. 9 is a block diagram depicting a compiler environment 900 that can be utilized to produce implementation code (e.g., executable, intermediate language . . . ). The compiler environment 900 includes a compiler 910 including a mapping component 914 for converting data formats, a front-end component 920, a converter component 930, a back-end component 940, an error checker component 950, a symbol table 960, a parse tree 970, and state 980. The compiler 910 accepts source code as input and produces implementation code as output. The input can include but is not limited to delimited programmatic expressions or qualified identifier as described herein. The relationships amongst the components and modules of the compiler environment illustrate the main flow of data. Other components and relationships are not illustrated for the sake of clarity and simplicity. Depending on implementation, components can be added, omitted, split into multiple modules, combined with other modules, and/or other configurations of modules.

The compiler 920 can accept as input a file having source code associated with processing of a sequence of elements. The source code may include various expressions and associated functions, methods and/or other programmatic constructs. The compiler 920 may process source code in conjunction with one or more components for analyzing constructs and generating or injecting code.

A front-end component 920 reads and performs lexical analysis upon the source code. In essence, the front-end component 920 reads and translates a sequence of characters (e.g., alphanumeric) in the source code into syntactic elements or tokens, indicating constants, identifiers, operator symbols, keywords, and punctuation among other things.

The converter component 930 parses the tokens into an intermediate representation. For instance, the converter component 930 can check syntax and group tokens into expressions or other syntactic structures, which in turn coalesce into statement trees. Conceptually, these trees form a parse tree 970. Furthermore and as appropriate, the converter module 930 can place entries into a symbol table 930 that lists symbol names and type information used in the source code along with related characteristics.

A state 980 can be employed to track the progress of the compiler 910 in processing the received or retrieved source code and forming the parse tree 970. For example, different state values indicate that the compiler 910 is at the start of a class definition or functions, has just declared a class member, or has completed an expression. As the compiler progresses, it continually updates the state 980. The compiler 910 may partially or fully expose the state 980 to an outside entity, which can then provide input to the compiler 910.

Based upon constructs or other signals in the source code (or if the opportunity is otherwise recognized), the converter component 930 or another component can inject code corresponding to facilitate efficient and proper execution. Rules coded into the converter component 930 or other component indicates what must be done to implement the desired functionality and identify locations where the code is to be injected or where other operations are to be carried out. Injected code typically includes added statements, metadata, or other elements at one or more locations, but this term can also include changing, deleting, or otherwise modifying existing source code. Injected code can be stored as one or more templates or in some other form. In addition, it should be appreciated that symbol table manipulations and parse tree transformations can take place.

Based on the symbol table 960 and the parse tree 970, a back-end component 940 can translate the intermediate representation into output code. The back-end component 940 converts the intermediate representation into instructions executable in or by a target processor, into memory allocations for variables, and so forth. The output code can be executable by a real processor, but output code that is executable by a virtual processor can also be provided.

Furthermore, the front-end component 920 and the back end component 940 can perform additional functions, such as code optimization, and can perform the described operations as a single phase or in multiple phases. Various other aspects of the components of compiler 910 are conventional in nature and can be substituted with components performing equivalent functions. Additionally, at various stages during processing of the source code, an error checker component 950 can check for errors such as errors in lexical structure, syntax errors, and even semantic errors. Upon detection error, checker component 950 can halt compilation and generate a message indicative of the error.

Figure 10:
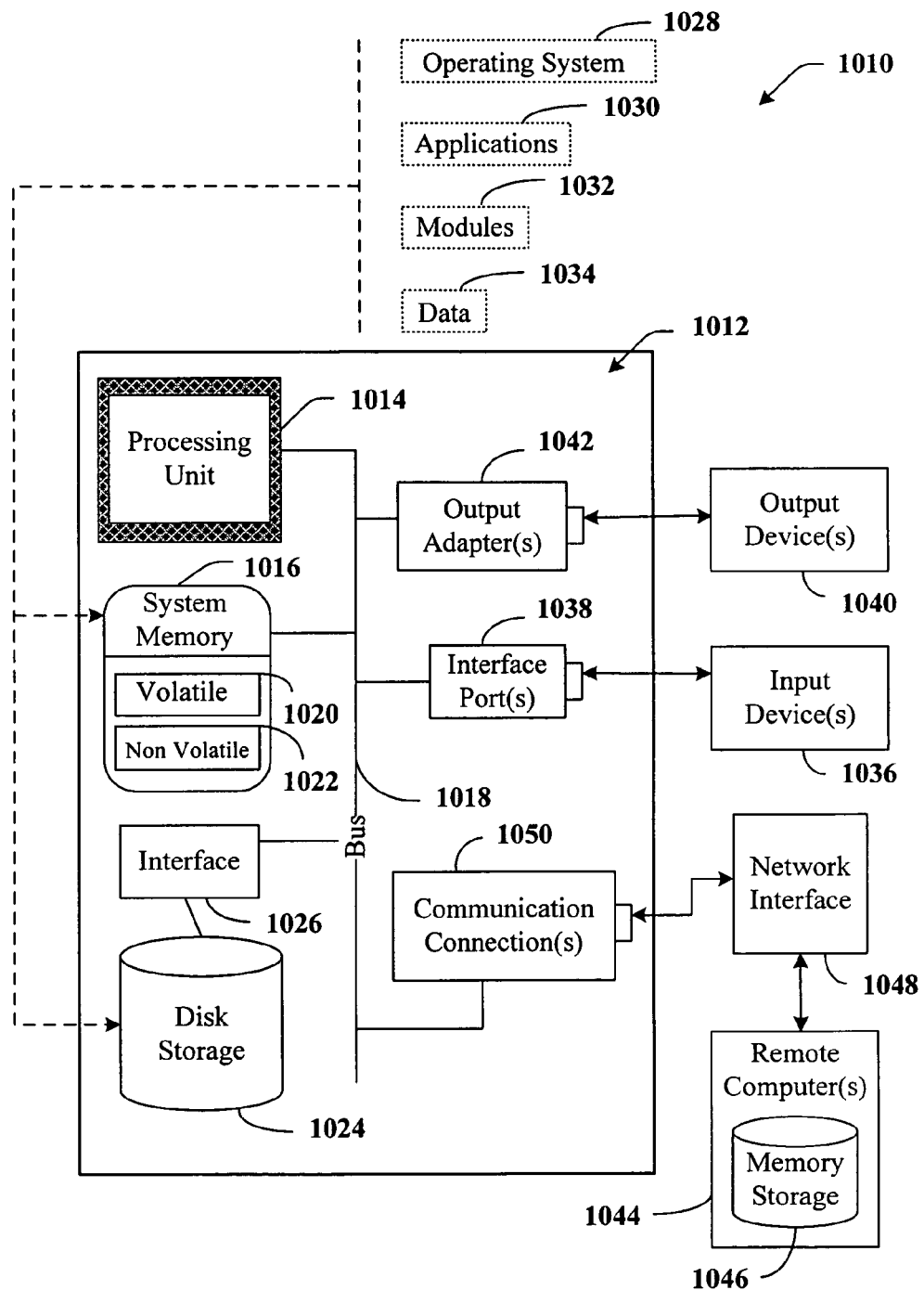
FIG. 10 is a schematic block diagram illustrating a suitable operating environment.
Figure 11:
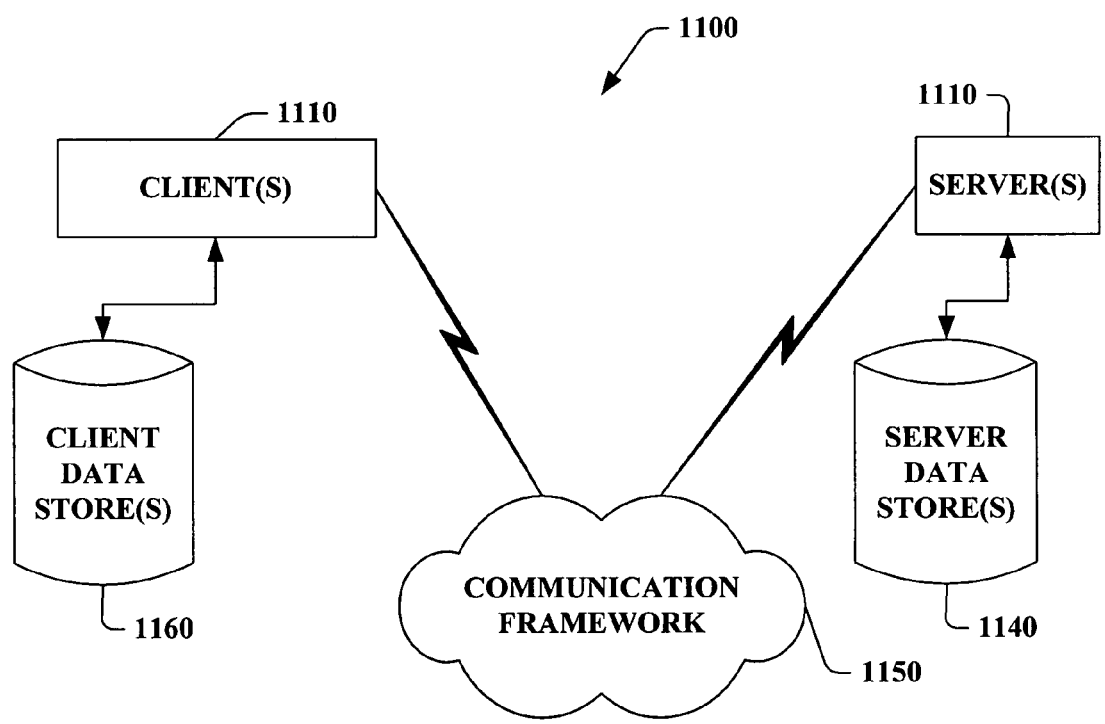
FIG. 11 is a schematic block diagram of a sample-computing environment.

In order to provide a context for the various aspects of the disclosed subject matter, FIGS. 10 and 11 as well as the following discussion are intended to provide a brief, general description of a suitable environment in which the various aspects of the disclosed subject matter may be implemented. While the subject matter has been described above in the general context of computer-executable instructions of a computer program that runs on a computer and/or computers, those skilled in the art will recognize that the invention also may be implemented in combination with other program modules. Generally, program modules include routines, programs, components, data structures, etc. that perform particular tasks and/or implement particular abstract data types. Moreover, those skilled in the art will appreciate that the inventive methods may be practiced with other computer system configurations, including single-processor or multiprocessor computer systems, mini-computing devices, mainframe computers, as well as personal computers, hand-held computing devices (e.g., personal digital assistant (PDA), phone, watch . . . ), microprocessor-based or programmable consumer or industrial electronics, and the like. The illustrated aspects may also be practiced in distributed computing environments where tasks are performed by remote processing devices that are linked through a communications network. However, some, if not all aspects of the invention can be practiced on stand-alone computers. In a distributed computing environment, program modules may be located in both local and remote memory storage devices.

With reference to FIG. 10, an exemplary environment 1010 for implementing various aspects described herein includes a computer 1012. The computer 1012 includes a processing unit 1014, a system memory 1016, and a system bus 1018. The system bus 1018 couples system components including, but not limited to, the system memory 1016 to the processing unit 1014. The processing unit 1014 can be any of various available processors. Dual microprocessors and other multiprocessor architectures also can be employed as the processing unit 1014.

The system bus 1018 can be any of several types of bus structure(s) including the memory bus or memory controller, a peripheral bus or external bus, and/or a local bus using any variety of available bus architectures including, but not limited to, 11-bit bus, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Universal Serial Bus (USB), Advanced Graphics Port (AGP), Personal Computer Memory Card International Association bus (PCMCIA), and Small Computer Systems Interface (SCSI).

The system memory 1016 includes volatile memory 1020 and nonvolatile memory 1022. The basic input/output system (BIOS), containing the basic routines to transfer information between elements within the computer 1012, such as during start-up, is stored in nonvolatile memory 1022. By way of illustration, and not limitation, nonvolatile memory 1022 can include read only memory (ROM), programmable ROM (PROM), electrically programmable ROM (EPROM), electrically erasable ROM (EEPROM), or flash memory. Volatile memory 1020 includes random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM).

Computer 1012 also includes removable/non-removable, volatile/non-volatile computer storage media. FIG. 10 illustrates, for example a disk storage 1024. Disk storage 1024 includes, but is not limited to, devices like a magnetic disk drive, floppy disk drive, tape drive, Jaz drive, Zip drive, LS-100 drive, flash memory card, or memory stick. In addition, disk storage 1024 can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 1024 to the system bus 1018, a removable or non-removable interface is typically used such as interface 1026.

It is to be appreciated that FIG. 10 describes software that acts as an intermediary between users and the basic computer resources described in suitable operating environment 1010. Such software includes an operating system 1028. Operating system 1028, which can be stored on disk storage 1024, acts to control and allocate resources of the computer system 1012. System applications 1030 take advantage of the management of resources by operating system 1028 through program modules 1032 and program data 1034 stored either in system memory 1016 or on disk storage 1024. It is to be appreciated that various components described herein can be implemented with various operating systems or combinations of operating systems.

A user enters commands or information into the computer 1012 through input device(s) 1036. Input devices 1036 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1014 through the system bus 1018 via interface port(s) 1038. Interface port(s) 1038 include, for example, a serial port, a parallel port, a game port, and a universal serial bus (USB). Output device(s) 1040 use some of the same type of ports as input device(s) 1036. Thus, for example, a USB port may be used to provide input to computer 1012, and to output information from computer 1012 to an output device 1040. Output adapter 1042 is provided to illustrate that there are some output devices 1040 like monitors, speakers, and printers, among other output devices 1040, that require special adapters. The output adapters 1042 include, by way of illustration and not limitation, video and sound cards that provide a means of connection between the output device 1040 and the system bus 1018. It should be noted that other devices and/or systems of devices provide both input and output capabilities such as remote computer(s) 1044.

Computer 1012 can operate in a networked environment using logical connections to one or more remote computers, such as remote computer(s) 1044. The remote computer(s) 1044 can be a personal computer, a server, a router, a network PC, a workstation, a microprocessor based appliance, a peer device or other common network node and the like, and typically includes many or all of the elements described relative to computer 1012. For purposes of brevity, only a memory storage device 1046 is illustrated with remote computer(s) 1044. Remote computer(s) 1044 is logically connected to computer 1012 through a network interface 1048 and then physically connected via communication connection 1050. Network interface 1048 encompasses communication networks such as local-area networks (LAN) and wide-area networks (WAN). LAN technologies include Fiber Distributed Data Interface (FDDI), Copper Distributed Data Interface (CDDI), Ethernet/IEEE 802.3, Token Ring/IEEE 802.5 and the like. WAN technologies include, but are not limited to, point-to-point links, circuit switching networks like Integrated Services Digital Networks (ISDN) and variations thereon, packet switching networks, and Digital Subscriber Lines (DSL).

Communication connection(s) 1050 refers to the hardware/software employed to connect the network interface 1048 to the bus 1018. While communication connection 1050 is shown for illustrative clarity inside computer 1012, it can also be external to computer 1012. The hardware/software necessary for connection to the network interface 1048 includes, for exemplary purposes only, internal and external technologies such as, modems including regular telephone grade modems, cable modems and DSL modems, ISDN adapters, and Ethernet cards.

FIG. 11 is a schematic block diagram of a sample-computing environment 1100 that can be employed. The system 1100 includes one or more client(s) 1110. The client(s) 1110 can be hardware and/or software (e.g., threads, processes, computing devices). The system 1100 also includes one or more server(s) 1130. The server(s) 1130 can also be hardware and/or software (e.g., threads, processes, computing devices). The servers 1130 can house threads to perform transformations by employing the components described herein, for example. One possible communication between a client 1110 and a server 1130 may be in the form of a data packet adapted to be transmitted between two or more computer processes. The system 1100 includes a communication framework 1150 that can be employed to facilitate communications between the client(s) 1110 and the server(s) 1130. The client(s) 1110 are operably connected to one or more client data store(s) 1160 that can be employed to store information local to the client(s) 1110. Similarly, the server(s) 1130 are operably connected to one or more server data store(s) 1140 that can be employed to store information local to the servers 1130.

What has been described above includes various exemplary aspects. It is, of course, not possible to describe every conceivable combination of components or methodologies for purposes of describing these aspects, but one of ordinary skill in the art may recognize that many further combinations and permutations are possible. Accordingly, the aspects described herein are intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A computer-implemented software testing system retained upon a storage medium, comprising:
    a rules component that includes rules that specify a data domain for test data, the data domain provides general representations of data types; and
    a data generator that generates a test data set within the data domain specified by the rules, the test data set comprises specific instances of data types in accordance with the general representations of data types defined by the data domain and a platform environment retaining one or more software portions, the test data set is employed to test the functionality of the one or more software portions.

2. The system of claim 1, the software portions represent one or more algorithms and the test data set tests at least limits of the one or more algorithms.

3. The system of claim 1, the rules component specifies the data domain through at least one of a grammar or attributed classes.

4. The system of claim 1, further comprising at least one interface to convert general representations of data types in the data domain into specific instances of data types with arbitrary values.

5. The system of claim 1, the data generator generates primitive scalar types including integer, character, and floating point data types.

6. The system of claim 1, the data generator generates data types created from compositions of scalar types.

7. The system of claim 1, the data generator processes complex data structures including data classes.

8. The system of claim 1, the data generator comprises a grammar reader to interpret a grammar of the data domain to create general representations of data types within the data domain.

9. The system of claim 1, further comprising a derivation space explorer to explore the data domain and produce general representations of data types within the data domain.

10. The system of claim 1, further comprising at least one grammar string file to describe one or more data domains.

11. The system of claim 1, further comprising an execution file to generate a data domain.

12. The system of claim 11, the execution file further comprising at least one of an assembly name, a class, an action driver, an action name, a parameter, an action, an execution statement, an expression, and a rule.

13. The system of claim 1, further comprising at least one data generator class, interface, delegate, and enumeration, the data generator includes at least one data converter function.

14. The system of claim 1, further comprising at least one grammar explorer interface to facilitate a data generation function.

15. The system of claim 1, further comprising a computer readable medium having computer readable instructions stored thereon for implementing the rules component or the data generator.

16. A computer-readable storage medium having stored thereon computer-readable instructions that implement a data generation method, comprising:
 defining one or more rules that specify a data domain, the data domain defines generic representations of data types suitable to assess a test subject;
 encoding the one or more rules in a file;
 automatically generating a data set within the data domain specified in the rules the data set comprises specific instances of data in accordance with the generic representations defined by the data domain; and
 employing the data set to test one or more portions of computer executable instructions.

17. The method of claim 16, further comprising defining a language to express the data domain.

18. The method of claim 17, further comprising defining one or more interfaces to generate the domain.

* * * * *

UNITED STATES PATENT AND TRADEMARK OFFICE
CERTIFICATE OF CORRECTION

| | | |
|---|---|---|
| PATENT NO. | : 7,409,619 B2 | Page 1 of 1 |
| APPLICATION NO. | : 11/210051 | |
| DATED | : August 5, 2008 | |
| INVENTOR(S) | : Ibrahim Khalil Ibrahim El Far et al. | |

It is certified that error appears in the above-identified patent and that said Letters Patent is hereby corrected as shown below:

In column 18, line 13, in Claim 16, delete "rules" and insert -- rules, --, therefor.

Signed and Sealed this

Twenty-sixth Day of April, 2011

David J. Kappos
*Director of the United States Patent and Trademark Office*